United States Patent [19]

Bolon et al.

[11] 4,088,801

[45] May 9, 1978

[54] U.V. RADIATION CURABLE ELECTRICALLY CONDUCTIVE INK AND CIRCUIT BOARDS MADE THEREWITH

[75] Inventors: Donald A. Bolon, Scotia; Gary M. Lucas; Siegfried H. Schroeter, both of Schenectady, all of N.Y.

[73] Assignee: General Electric Company, Schenectady, N.J.

[21] Appl. No.: 681,591

[22] Filed: Apr. 29, 1976

[51] Int. Cl.² ........................... B05D 5/06; H01B 1/02
[52] U.S. Cl. ................................ 427/54; 204/159.14; 204/159.15; 427/96; 427/125; 427/126; 252/512; 252/513; 252/514; 252/518; 428/388; 428/406
[58] Field of Search ................... 427/54, 96, 125, 126; 252/514, 518, 512; 204/159.14, 159.15

[56] References Cited

U.S. PATENT DOCUMENTS

| | | | |
|---|---|---|---|
| 3,661,615 | 5/1972 | Gray et al. | 427/96 |
| 3,904,783 | 9/1975 | Nara et al. | 427/54 |
| 3,957,694 | 5/1976 | Bolon et al. | 252/514 |
| 3,968,056 | 7/1976 | Bolon et al. | 252/514 |
| 3,989,644 | 11/1976 | Bolon et al. | 252/514 |

*Primary Examiner*—John T. Goolkasian
*Attorney, Agent, or Firm*—William A. Teoli; Joseph T. Cohen; Jerome C. Squillaro

[57] ABSTRACT

A method is provided for making circuit boards having improved stability and articles made therefrom. In addition, UV-curable ink compositions are also provided convertible to conductive strips when printed onto nonconducting substrates and cured thereon. The conductive strips have improved resistance to salt contamination.

10 Claims, No Drawings

U.V. RADIATION CURABLE ELECTRICALLY CONDUCTIVE INK AND CIRCUIT BOARDS MADE THEREWITH

The present invention relates to circuit boards and a method for making such articles exhibiting improved resistance to change under tropical conditions and to salt contamination. More particularly, the present invention relates to the use of certain UV-curable compositions containing silver salts to minimize the effects of chloride contamination on circuit boards made by the screen printing and cure of such UV curable compositions.

As shown in copending application of Donald A. Bolon et al., Ser. No. 509,893, filed Sept. 27, 1974, and assigned to the same assignee as the present invention, Method For Making A Circuit Board And Article Made Thereby, a radiation curable ink can be screen printed onto a polystyrene substrate to produce a circuit board useful for activating high voltage flash lamps. A principle feature of the radiation curable ink composition used to make the circuit boards of Bolon et al. is the employment of a conductive filler which does not interfere with the radiation cure of the ink which can be applied in accordance with standard screen printing techniques. It has been found, however, that, although the resulting circuit board, having conductive strips patterned in accordance with the desired end use, can be satisfactorily employed in a variety of circuit board applications, the conductivity of the strips is sensitive to chloride contaminaton. It has been found, for example, that exposure of the circuit boards for a period of time, such as two weeks at 50° C, to concentrations of 750 parts per million of sodium chloride can transform the applied strips on the circuit board from the conductive state, such as 10 ohms-cm of specific resistivity to the nonconductive state, such as infinite resistance. It would be desirable, therefore, to improve the resistance of the circuit board to chloride contamination, for example, to higher levels of contamination which may be introduced by manual handling of the circuit boards or which may result from severe atmospheric conditions.

The present invention is based on the discovery that minor amounts of certain metal compounds, such as silver salts or mercury salts, free of halide ions, can be incorporated into the radiation curable ink composition of proportions of up to 0.01% to 10% by weight of the ink to substantially improve the resistance of the circuit board to chloride under tropical conditions.

One aspect of the present invention, therefore, is directed to a radiation curable ink comprising by volume,
 (A) from about 10% to 60% of an organic resin binder having a viscosity of from about 50–10,000 centipoises at 25° C and 0.01% to 10% by weight of a salt of silver or mercury free of halide ions and
 (B) from about 90% to 40% of a particulated electrically conductive metal containing material substantially free of metal containing material having an aspect ratio of diameter to thickness of a value of greater than 20.

Another aspect of the present invention is directed to a method for making a circuit board which comprises,
 (1) printing a radiation curable ink onto a nonconductive substrate to a desired circuit pattern, and
 (2) effecting the radiation cure of the radiation curable ink at ambient temperatures,
where said radiation curable ink is defined above.

Included in the soluble silver salts which can be used in the practice of the invention are, for example, silver acetate, silver propionate, silver laurate, silver lactate, silver pentafluoropropionate, silver tetrafluoroborate, silver trifluoroacetate, silver citrate, silver 2-ethyhexanoate, silver cyclohexane butyrate, silver oxalate, silver trifluoromethane sulfonate, silver naphthanate, etc. As used hereinafter, the term soluble silver salt includes any silver salt exhibiting water solubility of at least $1 \times 10^{-5}$ g/l at a temperature of 25° C. In addition to the aforementioned silver salts, there are also included mercury salts, such as mercurous acetate, mercurous formate, mercurous sulfate and the corresponding mercuric salts, etc.

The radiation curable inks which can be used in the practice of the method of the present invention are shown in copending application Ser. No. 509,822, filed Sept. 27, 1974, now U.S. Pat. No. 3,968,056 and assigned to the same assignee as the present invention. There is included, for example, a blend of a polyester and styrene as the organic resin binder, and silver coated glass spheres, or spheriods, sometimes referred to as "beads" which have an average diameter of about 6–125 microns and preferably 10–50 microns. These materials are commercially available and are made from glass spheres commonly employed as reflective filler materials. Also included are particulated metals such as iron, zinc, nickel, copper, etc., which have average diameters as previously defined and are substantially free of a nonconductive oxide coating. Procedures for making such conductive particles by plating with silver, or initially priming with copper followed by plating with silver, or noble metals, are shown by Ehrreich U.S. Pat. No. 3,202,483. Glass fibers coated with silver, copper or nickel as shown, for example, in French Pat. No. 1,531,272 also can be used.

Particulated metals such as iron, nickel, copper, zinc, etc., in the forming of spheres, spheroids, or oblong spheriods, metal or fibers also can be used which have been subjected to a hydrogen or other reducing atmosphere at elevated temperatures to effect the removal of an amount of nonconducting oxide coating sufficient to render the metal particles conductive. The particulated metal in reduced form can be shielded from oxygen prior to being treated with the organic resin binder. The resulting radiation curable ink can be stored under sealed conditions prior to use.

Some of the organic resin binders which can be used in making the UV curable inks of the present invention in combination with the above-described conductive particulated material are in the form of either low molecular weight aliphatically unsaturated organic polymers, or a mixture of an aliphatically unsaturated organic polymer in further combination with a copolymerizable aliphatically unsaturated organic monomer such as styrene. The aforementioned solventless aliphatically unsaturated organic resin materials can have a viscosity of from about 50 to 10,000 centipoises at 25° C.

One variety of the solventless resins which can be employed in combination with the particulated electrically conductive metal containing material as described above, in the production of the UV curable conductive ink of the present invention, are low molecular weight polyimides containing acrylamide unsaturation, such as shown in U.S. Pat. No. 3,535,148, Ravve. These materials can be colorless liquids having relatively low viscosity. Another example is low molecular weight polyesters containing acrylic unsaturation shown by U.S. Pat. NO. 3,567,494, Setko. Additional examples of solventless resins are acrylate esters, or methacrylic esters of polyhydric alcohols, such as shown by U.S. Pat. Nos. 3,551,246 and 3,551,235, Bassemir. Further examples are shown by Nass U.S. Pat. No. 3,551,311. In addition, there also is included acrylate or methacrylate esters, melamine, epoxy resins, allyl ethers of polyhydric alcohols, allyl esters of polyfunctional aliphatic or aromatic acids, low molecular weight maleimido substituted aromatic compounds, cinnamic esters of polyfunctional alcohols, or mixtures of such compounds, etc.

The organic resin binder which can be used in combination with the above described particulated electrically conductive metal containing materials can be further defined as unsaturated polymers, for example, a polyester from a glycol and $\alpha,\beta$-unsaturated dicarboxylic acids, such as maleic and fumaric acids, with or without other dicarboxylic acids free of $\alpha,\beta$-unsaturation, such as phthalic, isophthalic, succinic, etc., dissolved in a copolymerizable aliphatically unsaturated organic solvent, such as styrene, vinyl toluene, divinyl benzene, methyl methacrylate, etc., or mixtures of such materials. Examples of such solventless resin compositions are shown by U.S. Pat. Nos. 2,673,141 and 3,326,710, Brody; a further example is shown by South African Pat. No. 694,724. Also included are unsaturated organosiloxanes having from 5 to 18 silicon atoms, which can be employed in combination with a vinylic organic monomer.

In instances where it is desired to make UV curable inks, UV sensitizers can be employed when the organic resin binder is in the form of a polyester or polyacrylate or other polymerizable UV curable material. There can be employed from about 0.5 to 5% by weight of the UV sensitizer based on the weight of resin. Included among the ultraviolet radiation photosensitizers which can be used are, for example, ketones such as benzophenone, acetophenone, benzil, benzyl methyl ketone; benzoins and substituted benzoins such as benzoin methyl ether, α-hydroxymethyl benzoin isopropyl ether; sulfur compounds such as thiourea, aromatic disulfides, and other photosensitizers such as azides, thioketones, or mixtures thereof. There also can be used in the ink, UV stabilizers and antioxidants such as hydroquinone, tert butyl hydroquinone, tert butyl catechol, p-benzoquinone, 2,5-diphenylbenzoquinone, 2,6-di-ter-butyl-p-cresol, benzotriazoles such as Tinuvin P (manufactured by Giegy Corp.), hydroxybenzophenones, such as 2,4-hydroxybenzophenone, 2-hydroxy-4-methoxy-benzophenone, 4-dodecyl-2-hydroxybenzophenone, substituted acrylonitriles such as ethyl-2-cyano-3,3-diphenyl acrylate, 2-ethylhexyl-2-cyano-3,3-diphenyl acrylate, etc.

In addition, as shown by copending application Ser. No. 509,822 now U.S. Pat. No. 3,957,694, assigned to the same assignee as the present invention, small amounts of a paraffin wax, up to 2% by weight, such as a 135° F MP can be incorporated into resins which contain polymerizable groups subject to oxygen inhibition. Such was substantially reduces such oxygen inhibition which manifests itself as surface tack. Alternatively, the wax may be omitted when radiation cures are to be conducted in an inert atmosphere. It also has been found that the conductivity of the cured ink can be impaired if chloride containing components are used which introduce more than 100 parts of chloride, per million of organic resin binder.

Additional examples of the organic resin binder which can be used in the practice of the invention are radiation curable epoxy compositions shown in copending applications of James V. Crivello, Ser. Nos. 638,982, 638,983 and 638,994, filed Dec. 9, 1975, assigned to the same assignee as the present invention. These Crivello compositions are one-package radiation curable epoxy resins containing aromatic onium salts of the Group VIa elements, such as sulfur, aromatic halonium salts, and Group VA elements such as arsenic, which break down under the influence of radiant energy to release a Bronsted acid catalyst to effect the cure of the epoxy resin.

The epoxy resins which also can be utilized as the organic resin binder to produce the photo curable inks of the present invention includes any monomeric, dimeric or oligomeric or polymeric epoxy material containing one or a plurality of epoxy functional groups. Diluents, such as 4-vinylcyclohexene dioxide, limonene dioxide, 1,2-cyclohexene oxide, styrene oxide, etc., may be added as viscosity modifying agents.

In the practice of the invention, the radiation curable ink can be made by simply blending the particulated electrically conductive metal containing material, which may be referred to hereinafter as the "conductive filler", with the organic resin binder containing the silver salt and other ingredients, such as nonionic surfactant, wax, photoinitiator, etc., which hereinafter is referred to as the resin.

Depending upon such factors as the viscosity of the resin, and the particle size and nature of the conductive filler, the resulting UV-curable ink can vary widely and can be a free flowing fluid or a paste. In instances where it is desired to make a U.V. curable conductive ink, a photosensitizer can be incorporated into the resin prior to blending with the conductive filler. There can be employed on a weight basis from about 0.5 part to 10 parts of filler per part of resin. If desired, electron beam cure of the ink also can be effected.

Blending can be achieved by stirring the ingredients in a suitable container. In instances where the conductive filler is in the form of particulated metal which has been freshly subjected to hydrogen reduction at temperatures of 300° C to 800° C to effect reduction of oxide coatings, or a chemical treatment involving the use of ammonium persulfate solution to dissolve the oxide coating, a special blending technique is preferably employed. The resin can be treated with a dry inert gas, such as passing the gas under the resin surface along with agitation to remove any oxygen, or moisture therefrom. Blending with the freshly reduced filler is also achieved under sealed conditions such as a dry box. The resulting UV-curable conductive ink can be used in a standard manner to produce desirable conductive coatings, if radiated with ultraviolet light within a reasonable time after being applied to a substrate such as up to 20 minutes.

In order that those skilled in the art will be better able to practice the invention, the following examples are given by way of illustration, and not by way of limitation. All parts are by weight unless otherwise indicated.

EXAMPLE 1

A polyester prepolymer was prepared by effecting reaction between about 35.3 parts of fumaric acid, 11.9 parts of dicyclopentadiene and 25.3 parts of propylene glycol. The resulting prepolymer was blended with about 24.4 parts of styrene containing 100 ppm of tertbutyl-hydroquinone, 5 parts of nonionic polyalkylene oxide block copolymer surfactant, 1.8 parts of benzoin-sec-butylether, 0.7 part of 135° F paraffin wax and 2 parts of silver acetate. The resulting mixture was warmed until a solution was obtained.

A photocurable ink was prepared by blending about 33 parts of the above organic resin binder with 67 parts of silver coated glass spheres having an average diameter of about 10–50 microns. On a volume basis, there was employed about 2 volumes of conductive filler per volume of resin.

Four 5 inch × 0.040 inch × 0.005 inch strips were printed onto 1½ inch by 5 inch polystyrene substrates in accordance with the procedure shown in application Ser. No. 509,893, filed Sept. 27, 1974 and assigned to the same assignee as the present invention. The treated polystyrene substrates were then placed at a distance of about 8 inches from the arc tube of a General Electric H3T7 lamp which has been ballasted to permit operation at about 960 Watts input. There were employed two quartz filters below the lamp having dimensions of about 5 inches × 10 inches. The filters were supported on steel supports which formed a channel through which air was blown. The upper filter support was in contact with a 6' copper coil having an average diameter of about ⅜ inches through which water was passed at about 25° C. The full intensity of the lamps was measured at about 20,000 $\mu\omega/cm^2$ and the temperature of the substrate did not exceed about 50° C. The panels were then cured for two minutes.

A series of conductive strips on polystyrene substrates were again prepared, following the same procedure except that the photocurable ink used was free of silver salt. The average resistance of the conductive strips was then measured. It was found that the conductive strips free of silver acetate had an average resistance in the range of 35 Ohms to 65 Ohms, while the strips containing silver acetate had an average resistance of 57 to 77 Ohms.

The substrates were then respectively immersed in aqueous sodium chloride solutions having concentrations of from 0.1 ppm to 2000 ppm of sodium chloride. After two weeks immersion at 50° C, the strips were wiped free of excess solution and immediately tested for conductivity. It was found that the conductivity of the strips had not changed substantially after immersion in salt solutions at concentrations of up to 500 ppm. However, the strips free of silver acetate were non-conductive or had "∞" resistance at concentrations of 750 ppm or greater. Table I below shows the ability of the strips made in accordance with the present invention to resist change at concentrations of between 500 to 5000 ppm.

Table I

| Sodium Chloride PPM | Resistance (Ω) before Immersion | Resistance (Ω) Immersion |
|---|---|---|
| 500 | 70 | 95 |
| 1000 | 63 | 100 |
| 2000 | 77 | 180 |
| 3000 | 75 | 650 |
| 4000 | 69 | 800 |
| 5000 | 65 | ∞ |

The above results establishes that conductive strips made in accordance with the invention have superior resistance to exposure by chloride derived from various sources of contaminaton.

EXAMPLE 2

The procedure of Example 1 was repeated except that silver nitrate was used instead of silver acetate. It was found that the conductive strips prior to immersion had a resistance of from 63 to 110 Ohms. After immersion substantially no change in resistance occurred at concentrations of up to 200 ppm of sodium chloride. Table II shows the change in resistance after immersion in salt solution of greater than 350 ppm of sodium chloride.

Table II

| Sodium Chloride PPM | Resistance (Ω) Before Immersion | Resistance (Ω) After Immersion |
|---|---|---|
| 300 | 63 | 200 |
| 400 | 75 | 100 |
| 500 | 85 | 800 |
| 1000 | 60 | 200 |
| 2000 | 110 | $2 \times 10^6$ |
| 3000 | 90 | $5 \times 10^4$ |
| 4000 | 90 | ∞ |

The above results show that significant resistance to change in conductivity is exhibited by the strips containing the silver nitrate after immersion in salt solutions at 1000 ppm of sodium chloride and higher. This is to be contrasted to the results obtained when the conductive strips free of silver salt were rendered nonconducting after immersion in salt solution having 750 ppm or greater of sodium chloride.

Although the above examples are limited to only a few of the very many variables to which the method of the present invention can be practiced, it should be understood that the present invention is directed to the use of a much broader class of curable ink compositions as set forth in the description preceding these examples. In addition, the ink composition of the present invention can contain any one or more of water soluble silver salts, or mercury salts including those shown in the preceding description.

What we claim as new and desire to secure by Letters Patent of the United States is:

1. A method for making a circuit board which comprises,
    (1) printing a UV radiation curable ink onto a nonconductive substrate to a desired circuit pattern, and
    (2) effecting the radiation cure of the radiation curable ink at ambient temperatures, where said radiation curable ink comprises by volume,
    (A) from about 10% to 60% of an organic resin binder having a viscosity of from about 50–10,000 centipoises at 25° C and 0.01% to 10% of a salt of silver or mercury free of halide ions having a water solubility of at least $1 \times 10^{-5}$ g/l at 25° C and
    (B) from about 90% to 40% of a particulated electrically conductive metal containing material having from about 0 to about 15% by weight of metal flake based on the weight of particulated electrically conductive metal containing material.

2. A circuit board made in accordance with claim 1.

3. A method in accordance with claim 1, where the curable ink utilizes silver coated glass spheres or spheriods as the particulated electrically conductive metal containing material.

4. A method in accordance with claim 1, where the nonconductive substrate is polystyrene.

5. A method in accordance with claim 1, where a mixture of polyester resin and styrene are used as the organic resin binder.

6. A method in accordance with claim 1, where the radiation curable ink contains silver acetate as a water soluble silver salt.

7. A method in accordance with claim 1, where the radiation curable ink contains silver nitrate as the water soluble silver salt.

8. A UV radiation curable ink comprising by volume,
(A) from about 10% to 60% of an organic resin binder having a viscosity of from about 50–10,000 centipoises at 25° C and .01% by weight of a salt of silver or mercury free of halide ions having a water solubility of at least $1 \times 10^{-5}$ g/l at 25° C and
(B) from about 90% to 40% of a particulated electrically conductive metal containing material having from about 0 to about 15% by weight of metal flake based on the weight of particulated electrically conductive metal containing material.

9. A method in accordance with claim 8, where the radiation curable ink contains silver acetate as a water soluble salt.

10. A method in accordance with claim 8, where the radiation curable ink contains silver nitrate as the water soluble silver salt.

* * * * *